(12) United States Patent
Finkelstein

(10) Patent No.: US 6,817,532 B2
(45) Date of Patent: Nov. 16, 2004

(54) WALLET CARD WITH BUILT-IN LIGHT

(75) Inventor: Alan Finkelstein, Beverly Hills, CA (US)

(73) Assignee: Lenscard U.S., LLC, Los Angeles, CA (US)

(*) Notice: Subject to any disclaimer, the term of this patent is extended or adjusted under 35 U.S.C. 154(b) by 0 days.

(21) Appl. No.: 10/167,259

(22) Filed: Jun. 11, 2002

(65) Prior Publication Data

US 2003/0201331 A1 Oct. 30, 2003

Related U.S. Application Data

(63) Continuation-in-part of application No. 09/767,317, filed on Jan. 22, 2001, which is a continuation-in-part of application No. 09/066,799, filed on Apr. 24, 1998, now Pat. No. 6,176,430, which is a continuation-in-part of application No. 08/758,640, filed on Nov. 27, 1996, now Pat. No. 5,856,661, which is a continuation-in-part of application No. 08/582,601, filed on Jan. 3, 1996, now Pat. No. 5,608,203, which is a continuation of application No. 08/250,801, filed on May 27, 1994, now abandoned, which is a continuation-in-part of application No. 08/197,218, filed on Feb. 16, 1994, now Pat. No. 5,434,405, which is a continuation-in-part of application No. 07/834,490, filed on Feb. 12, 1992, now Pat. No. 5,412,199.

(51) Int. Cl.$^7$ ............................................. G06K 19/06
(52) U.S. Cl. ..................... 235/492; 235/487; 235/488; 235/380
(58) Field of Search .................... 235/375, 380, 235/486, 487, 492, 454; 340/568.7, 5.6

(56) References Cited

U.S. PATENT DOCUMENTS

| | | |
|---|---|---|
| 373,597 A | 11/1887 | McMicken |
| 2,234,942 A | 3/1941 | Nichols |
| 2,631,368 A | 3/1953 | Baukus |
| 2,826,959 A | 3/1958 | Schneider |

(List continued on next page.)

FOREIGN PATENT DOCUMENTS

| | | |
|---|---|---|
| DE | 69200552.7 | 4/1992 |
| EP | H0805 D/31 | 12/1980 |
| EP | 0032368 | 7/1981 |
| EP | 323-108 A | 12/1987 |
| EP | 0 496 544 | 1/1992 |
| FR | 2 726 384 | 10/1994 |
| GB | 2 222 280 | 8/1998 |
| JP | 55-061587 | 5/1980 |
| JP | 55-83015 | 6/1980 |
| JP | 56-212679 | 12/1981 |
| JP | 59-124818 | 7/1984 |
| JP | 59-124819 | 7/1984 |
| JP | 361167506 | 7/1986 |
| JP | 1-171991 | 6/1989 |
| JP | 402006123 | 1/1990 |
| JP | 2-56680 | 4/1990 |
| JP | 2-92513 | 4/1990 |
| JP | 4-0191815 | 4/1992 |

Primary Examiner—Michael G. Lee
Assistant Examiner—Ahshik Kim
(74) Attorney, Agent, or Firm—Blakely, Sokoloff, Taylor & Zafman, LLP

(57) ABSTRACT

A wallet card, such as a financial transaction card, has a substantially non-foldable semi-rigid base. Optionally, the semi-rigid base may include a magnifying lens. One or more lights are disposed in the card base to provide illumination.

7 Claims, 4 Drawing Sheets

U.S. PATENT DOCUMENTS

| | | | |
|---|---|---|---|
| 3,108,853 A | 10/1963 | Short et al. | |
| 3,117,608 A | 1/1964 | Goss et al. | |
| 3,140,883 A | 7/1964 | Anthony | |
| 3,209,648 A | 10/1965 | Chapman | |
| 3,409,347 A | 11/1968 | Vogel | |
| 3,437,548 A | 4/1969 | Ayers | |
| 3,571,957 A | 3/1971 | Cumming | |
| 3,712,707 A | 1/1973 | Henkes, Jr. | |
| 3,963,309 A | 6/1976 | Schwab | |
| 4,011,857 A | 3/1977 | Rice | |
| 4,044,889 A | 8/1977 | Orentreich et al. | |
| 4,067,947 A | 1/1978 | Miori | |
| 4,076,384 A | 2/1978 | Deml et al. | |
| 4,137,863 A | 2/1979 | Anglin | |
| 4,294,782 A | 10/1981 | Froehlig | |
| 4,393,610 A | 7/1983 | Adrian | |
| 4,435,912 A | 3/1984 | Adrian et al. | |
| 4,486,363 A | 12/1984 | Pricone et al. | |
| 4,502,236 A | 3/1985 | Adrian | |
| 4,509,823 A | 4/1985 | Moriguchi et al. | |
| 4,571,497 A | 2/1986 | Henry et al. | |
| 4,601,861 A | 7/1986 | Pricone et al. | |
| 4,677,285 A | 6/1987 | Taniguchi | |
| 4,805,680 A | 2/1989 | Ueno | |
| 4,863,026 A | 9/1989 | Perkowski | |
| 4,881,334 A | 11/1989 | Brown | |
| 5,124,089 A | 6/1992 | Ohkoshi et al. | |
| 5,141,677 A | 8/1992 | Fogarty | |
| 5,151,582 A | 9/1992 | Fujioka | |
| 5,183,597 A | 2/1993 | Lu | |
| 5,198,168 A | 3/1993 | Thurston | |
| 5,215,334 A | 6/1993 | Presson et al. | |
| 5,359,597 A | 10/1994 | McLamb et al. | |
| 5,359,684 A | 10/1994 | Hosokawa et al. | |
| 5,534,101 A | 7/1996 | Keyworth et al. | |
| 5,642,228 A | 6/1997 | Takezawa et al. | |
| 5,677,568 A | 10/1997 | Ochi et al. | |
| 5,681,871 A | 10/1997 | Molock et al. | |
| 5,695,346 A | 12/1997 | Sekiguchi et al. | |
| 5,735,040 A | 4/1998 | Ochi et al. | |
| 5,856,661 A | 1/1999 | Finkelstein et al. | |
| 5,898,215 A * | 4/1999 | Miller et al. | 257/679 |
| 5,927,846 A | 7/1999 | Sinclair | |
| 6,065,674 A | 5/2000 | Shriver | |
| 6,070,990 A | 6/2000 | Dalton et al. | |
| 6,073,854 A | 6/2000 | Bravence et al. | |
| 6,188,309 B1 * | 2/2001 | Levine | 340/5.66 |
| 6,259,606 B1 | 7/2001 | Bunert | |
| 6,271,801 B2 | 8/2001 | Tuttle et al. | |
| 6,284,406 B1 * | 9/2001 | Xing et al. | 429/96 |
| 6,296,188 B1 * | 10/2001 | Kiekhaefer | 235/487 |
| 6,325,284 B1 | 12/2001 | Walker et al. | |
| 6,330,162 B2 | 12/2001 | Sakamoto et al. | |
| 6,390,372 B1 * | 5/2002 | Waters | 235/487 |
| 6,409,360 B2 * | 6/2002 | Contant et al. | 362/154 |

\* cited by examiner

WALLET CARD WITH BUILT-IN LIGHT

RELATED APPLICATIONS

This is a continuation-in-part of U.S. patent application Ser. No. 09/767,317 filed Jan. 22, 2001, which is a continuation-in-part of U.S. patent application Ser. No. 09/066,799 filed Apr. 24, 1998, now U.S. Pat. No. 6,176,430, which is a continuation-in-part of U.S. patent application Ser. No. 08/758,640 filed Nov. 27, 1996, now U.S. Pat. No. 5,856,661, which is a continuation-in-part of U.S. patent application Ser. No. 08/582,601 filed Jan. 3, 1996, now U.S. Pat. No. 5,608,203, which is a continuation of U.S. patent application Ser. No. 08/250,801 filed May 27, 1994, abandoned, which is a continuation-in-part of U.S. patent application Ser. No. 08/197,218, filed Feb. 16, 1994, now U.S. Pat. No. 5,434,405 which is a continuation-in-part of U.S. patent application Ser. No. 07/834,490, filed Feb. 12, 1992, now U.S. Pat. No. 5,412,199.

BACKGROUND OF THE INVENTION

1. Field of the Invention

The present invention relates to wallet cards and is specifically directed to a wallet card, such as a credit card, having a built-in light.

2. Background

The previously issued co-owned patents, namely, U.S. Pat. Nos. 5,412,199; 5,434,405; 5,608,203; 5,856,661; and 6,176,430 disclose wallet cards with integral magnifying lenses and methods for making such cards. The disclosures of these patents are incorporated herein by reference. Such wallet cards are convenient for magnifying and reading printed information, such as sales receipts and the like. Frequently, the user of such a card will desire to read information in a low light situation. To facilitate this, it is desirable to have a source of illumination in proximity to the magnifying lens. Even without a magnifying lens, there are many situations in which it would be desirable to have a wallet card that incorporates a source of illumination.

Heretofore, sources of illumination, e.g. flashlights, have been proposed with the same general shape as a credit card or a similar wallet card. Such a light is shown, for example, in U.S. Pat. No. 5,927,846. However, these prior art lights are significantly thicker than an ordinary credit card and, therefore, do not meet ISO standards for such cards. Accordingly, prior art card shaped lights are incapable of functioning as financial transaction cards.

SUMMARY OF THE INVENTION

The present invention provides a financial transaction card that has a thin, flat, substantially rigid substrate and a source of illumination disposed within the substrate. A source of electrical current is coupled to the source of illumination and a switch is provided to selectively close an electrical circuit between the source of electrical current and the source of illumination. As is customary for financial transaction cards, embossed alphanumeric indicia are included on the substrate.

Such a card may be made by printing first transaction card graphics on a first surface of a first core member and laminating a first overlay to the first surface of the first core member. A cavity is routed in a second surface of the first core member and a light is installed in the cavity. The cavity is then filled. Second transaction card graphics are printed on a first surface of a second core member and a second overlay is laminated thereto. The two core members are then joined by securing the second surface of the first core member to a second surface of the second core member.

BRIEF DESCRIPTION OF THE DRAWINGS

The invention may be more readily understood by referring to the accompanying drawings in which.

Like elements are numbered alike throughout the drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

Figure 1:
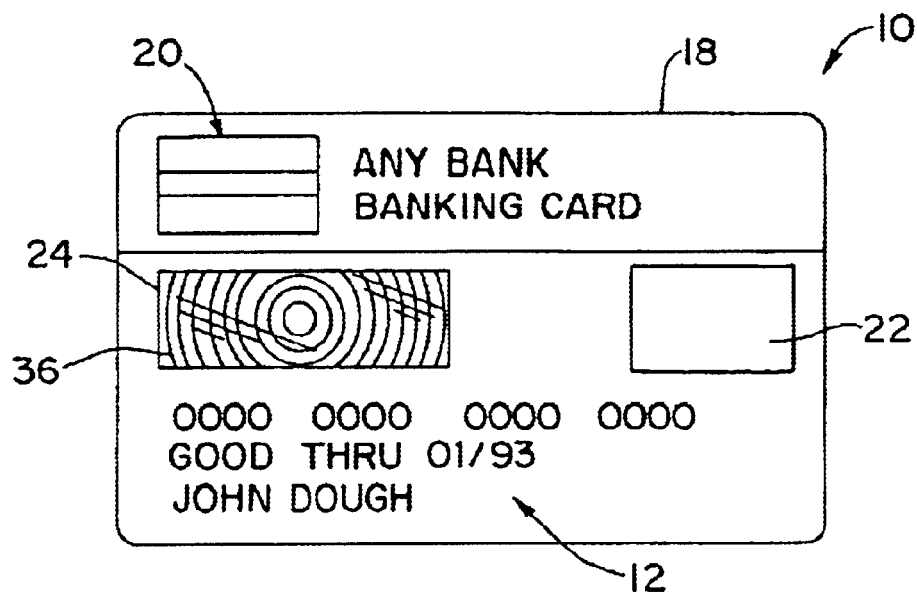
FIG. 1 shows the top side of a wallet card incorporating a magnifying lens.

A typical credit card 10 is shown in FIG. 1. The size and general layout of card 10 have become standardized and similar cards are widely used for a variety of transactions and other purposes. Apart from credit cards, similar cards are used as debit cards, ATM access cards, gift cards, driver's licenses, identification cards, library cards, etc. Such cards are typically carried in a wallet and are generally referred to herein as "wallet cards".

Figure 2:
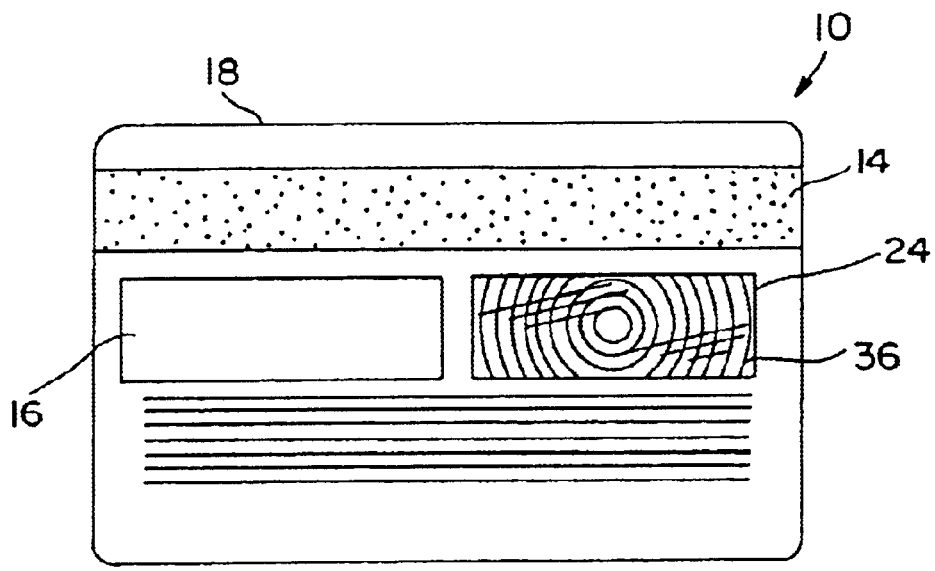
FIG. 2 shows the bottom side of the wallet card of FIG. 1.

Card 10 includes, as is common, embossed lettering at 12, which is machine readable for permitting the credit card to be imprinted at a point-of-sale transaction. As is shown in FIG. 2, most credit cards now contain a strip 14 for carrying machine readable information, for example a magnetic strip material which includes magnetically encoded information readable by computer terminals utilized in many point-of-sale terminals. Also included is a signature strip 16 which is on the back of the card and which typically is adapted for receiving a signature to be manually applied by the user of the card. The card may further include one- or multi-dimensional bar codes as well as smart card contact, contactless or combi-card electronic information storage.

The magnetic strip 14 and embossed lettering 12, along with the signature strip 16, identify a data zone on the card. For financial transaction cards, this data zone is generally controlled by ISO standards in an effort to standardize the cards so that various cards issued by a multiplicity of institutions may be used on standardized terminals the point-of-sale. For example, the placement of the magnetic strip 14 relative to the top edge 18 of the card is standardized, as is the width of the strip 14 in order to permit ready readability of the magnetically coded information by any typical point-of-sale magnetic reader. Likewise, the font, size and position of the embossed lettering 12 is controlled to assure machine readability of the information imprinted from the card when a point-of-sale transaction is made on a typical credit card imprinter. Only the position of the signature strip 16 can be altered without interfering with the machine readability of the card.

Today, many cards also include identifying indicia such as logotypes and the like as indicated at 20 for identifying the issuing institution. An increasing number of cards also include a hologram panel 22 which includes issuing institution indicia. The hologram panel 22 is generally located in or near the portion of the data zone including the embossed lettering 12. In the card shown in FIGS. 1 and 2, a magnifying lens 24 is positioned such that it is in non-interfering relationship with the magnetic strip 14 and the embossed lettering 12. The magnifying lens 24 is rectangular and is mounted parallel to the magnetic strip 14 in the space between the magnetic strip and the embossed lettering. This space is generally sufficient in size to accommodate the lens 24 since it is required that the embossed lettering 12 be spaced sufficiently from the magnetic strip 14 to assure that the embossing of the card does not in any way alter the functionality of the magnetic strip. A fresnel-type contour lens has been found to be particularly useful for this type of application. Such a lens is formed with concentric fresnel contour lines 36.

Figure 3:
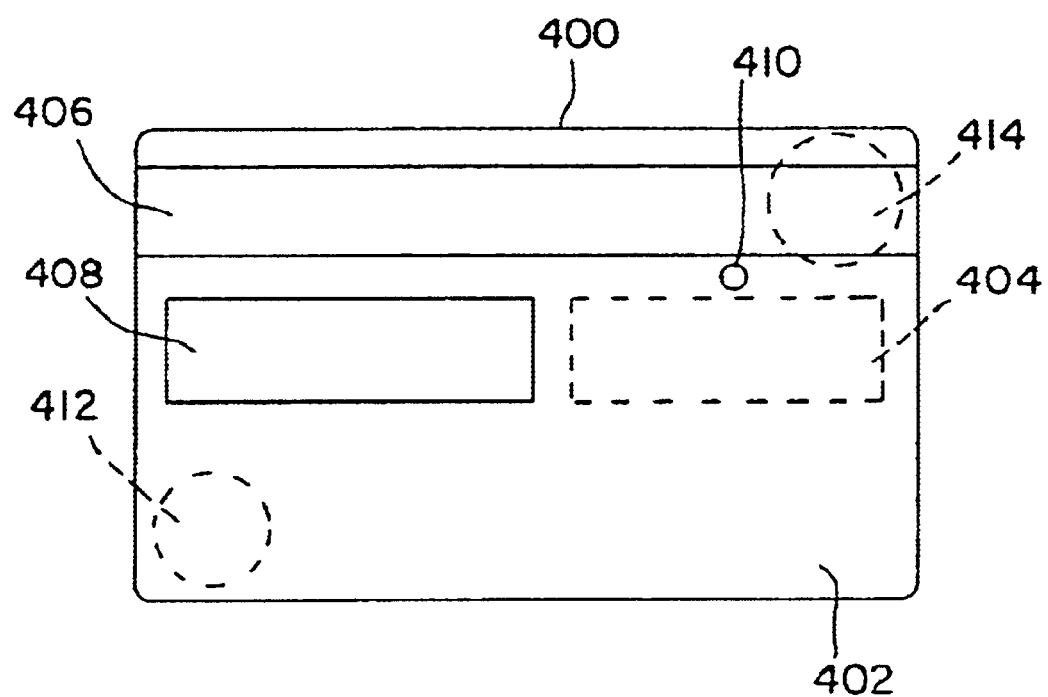
FIG. 3 is a plan view of a wallet card incorporating a light in accordance with the subject invention.

FIG. 3 illustrates a wallet card 400 having a light 410 disposed on the bottom or reverse side 402 of a wallet card. This is particularly useful for assisting the user in examining magnified objects in a darkened environment. Optionally, card 400 may incorporate a lens 404 formed by the methods described in the referenced patents. A magnetic stripe 406 and a signature panel 408 are provided as is customary. Light 410 is preferably a light-emitting diode (LED), although any other suitable source of illumination may be utilized, such as a conventional incandescent bulb, electroluminescent panel or the like. Although only a single light 410 is illustrated, a plurality of lights may be installed, if desired.

Light 410 is powered by one or more batteries 414 disposed within card 400. Conventional wafer cell batteries may be used or a flat laminated battery may be constructed integrally with the wallet card. Ultra-thin battery construction is described, for example, in U.S. Pat. Nos. 5,888,672 and 6,045,942.

To control operation of light 410, a switch, such as switch 412, is placed at a convenient location on card 400. Switch 412 is preferably a pressure sensitive switch that may be activated by finger pressure when card 400 is held between the thumb and index finger.

A method of manufacturing card 400 is illustrated in FIGS. 4A–4E. This method utilizes a split core construction to which front and rear overlays are laminated. A first core member 420 has a thickness of approximately 24.4 mils. The surface of core member 420 is printed with graphics appropriate for the particular card application. The printed surface of core member 420 is then laminated with overlay 422, which has a thickness of approximately 1.6 mils. The lamination process employs a pressure of about 400 psi and a temperature of about 100° C.

Figure 4A:
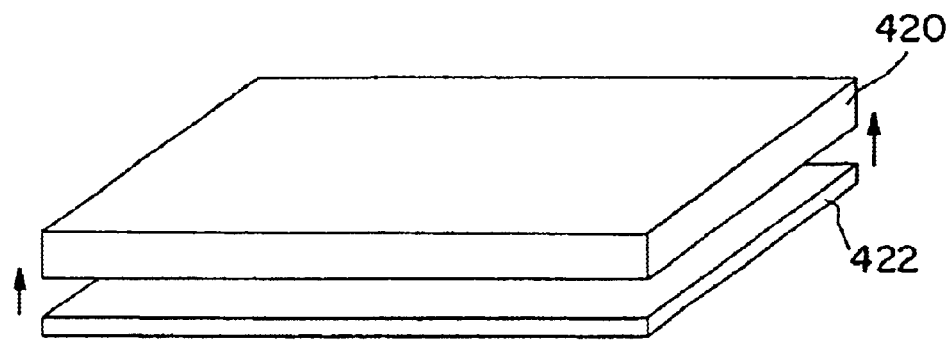
FIGS. 4A–4E illustrate a method of constructing a wallet card incorporating a light.
Figure 4B:
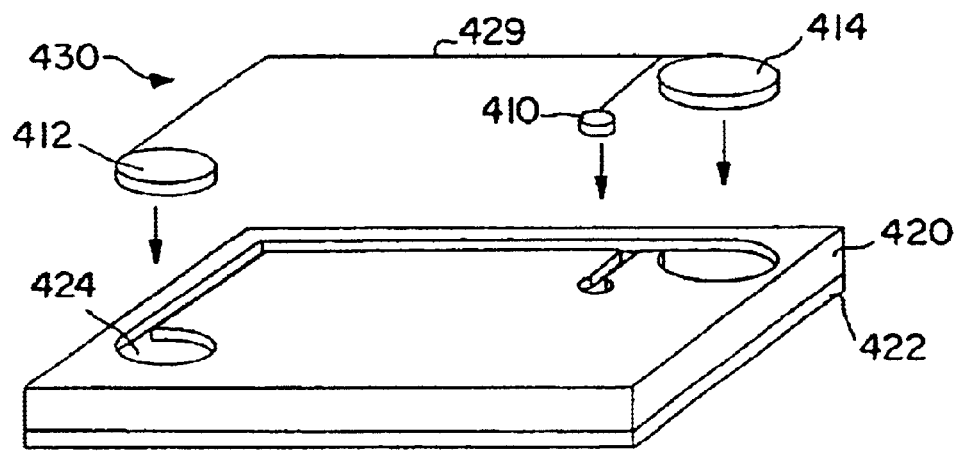

Referring next to FIG. 4B, a cavity 424 is milled or routed into core member 420 to accept the electronic components denoted generally by reference numeral 430. These components include battery 414, at least one light-emitting diode (LED) 410, switch 412 and interconnection circuitry 429. The interconnection circuitry may be formed within cavity 424 by a printing process with conductive ink or by deposition of metallic circuit traces. Alternatively, the entire floor of cavity 424 may be metallized and circuit traces nay then be formed using a conventional photoetching process. Once the interconnection circuitry has been formed, the battery 414, LED 410 and switch 412 are inserted in respective areas of the cavity and electrically bonded to the interconnection circuitry using conventional bonding techniques. In another alternative, the components may be first connected electrically and mounted as a unit on a suitable carrier prior to being inserted into cavity 424.

Figure 4C:
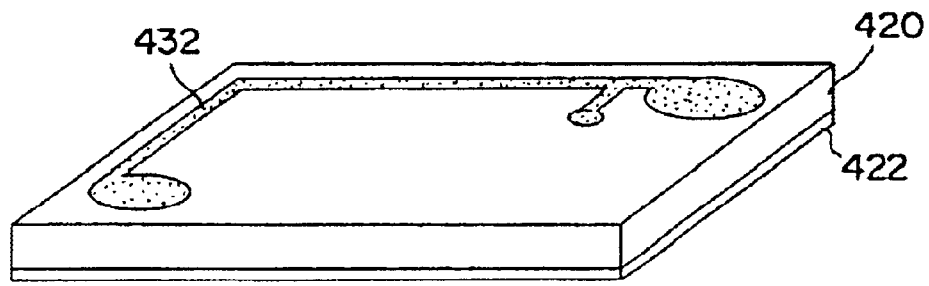

With reference now to FIG. 4C, the cavity 424 is filled with an ultraviolet (UV) curable resin or a similar potting compound. Once cured, the exposed compound 432 is milled or shaved flush with the surface of core member 420. This may be accomplished using a diamond impregnated fly cutter.

Figure 4D:
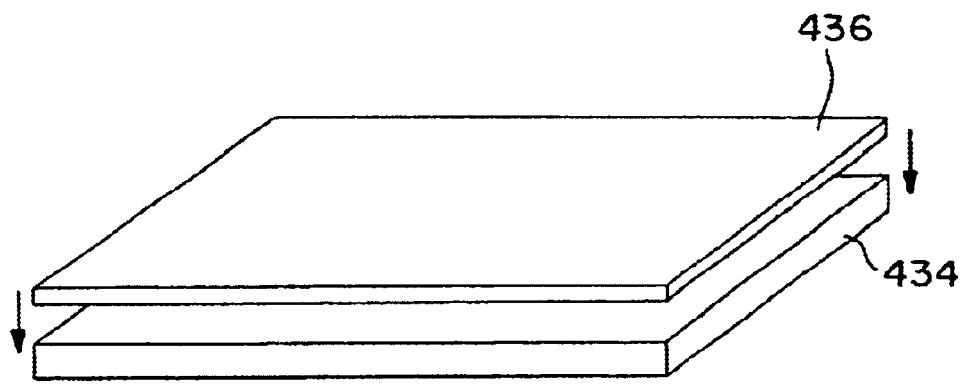

Turning next to FIG. 4D, a second core member 434 is printed with appropriate graphics and laminated with overlay 436. Core member 434 has a thickness of approximately 5 mils, which is about the minimum for use with existing printing and laminating processes.

Figure 4E:
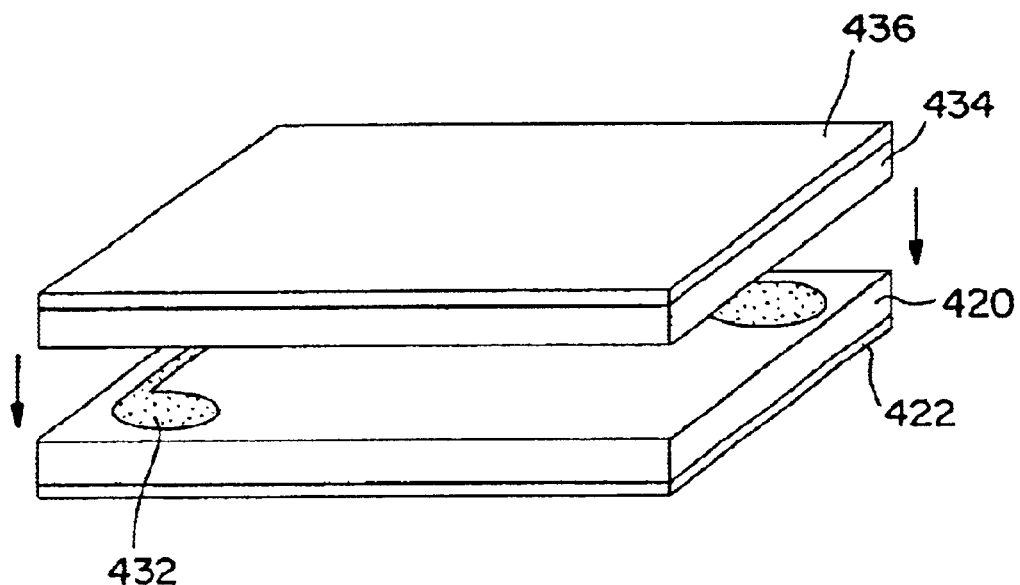

The core members 420 and 434 are joined together as shown in FIG. 4E. A hot lamination process may be used; however, the electronic components, particularly battery 426, may suffer adversely in such a process. In this case, core members 420 and 434 may be joined with a cold lamination process or may be glued together with a suitable adhesive. Acceptable adhesives are available that can join the core members at a temperature of only about 100° F., which is low enough to avoid damage to the electronic components. The finished card has a thickness of approximately 32.6 mils, close to the nominal 32 mil thickness established by ISO standards and well within the allowable tolerance.

Although FIGS. 4A–4E illustrate the manufacturer of a single card, it will be understood that a plurality of cards may be processed simultaneously in sheets and that the sheets may then be cut into individual cards after the process is complete. Also, while cavity 424 is shown as being formed in core member 420, cooperating cavities may be formed in the two core members, in which case they may be equal, or nearly so, in thickness.

As mentioned above, the completed card may include an integral magnifying lens, if desired. If so, core members 420 and 434 are preferably formed of a clear plastic material as described in the referenced patents. The graphic design imprinted on the surfaces of the core members will, of course, leave a transparent window where the lens is to be located. The lens may be formed by hot stamping fresnel contours as described in the referenced patents. Further processing of the card, such as embossing, the addition of holograms, magnetic stripes, etc. is accomplished in the same manner as for the previously patented embodiments. As mentioned above, appropriate care is taken to locate electronic components 430 in areas of the card that will not be subject to embossing.

The use of a clear plastic material for core member 420 and/or core member 434 allows formation of a collimating lens for LED 410. An LED typically disperses light over a wide angle. A collimating lens concentrates the light within a narrower angle so that card 400 is a more effective source of illumination. A collimating lens may be formed in the same manner as a magnifying lens. It will be understood, however, that incorporation of a collimating lens for LED 410 does not require that a magnifying lens also be included in card 400.

An alternative method of manufacturing card 400 is basically similar to the previously described method; however, the split core members are fabricated using an extrusion process. A first core member is extruded with a cavity in place. This core member is printed and laminated as in the previously described process. Furthermore, the electronic components are installed and potted in the same manner as previously described. A second core member is also extruded and is then laminated to the completed first core member.

It will be recognized that the above-described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A method of making a wallet card containing a light comprising:

forming a first core member;

laminating a first overlay to a first surface of the first core member;

forming a cavity in a second surface of the first core member;

assembling a circuit unit comprising a light, a battery and a switch;

installing the circuit unit in the cavity;

filling a remaining volume of the cavity with a curable resin;

planarizing the second surface of the first core member after the resin has cured;

forming a second core member;

laminating a second overlay to a first surface of the second core member;

securing the second surface of the first core member to a second surface of the second core member.

2. The method of claim 1 further comprising, before laminating the first overlay to the first surface of the first core member, printing first card graphics on the first surface of the first core member.

3. The method of claim 1 further comprising, before laminating the second overlay to the first surface of the second core member, printing second card graphics on the first surface of the second core member.

4. The method of claim 1 wherein the first and second core members are disposed on respective sheets, each sheet comprising a plurality of core members.

5. The method of claim 1 wherein the light comprises a light emitting diode.

6. The method of claim 1 wherein the first core member is secured to the second core member with an adhesive.

7. The method of claim 1 wherein the first core member is laminated to the second core member.

* * * * *